United States Patent [19]
Doessel

[11] Patent Number: 5,037,721
[45] Date of Patent: * Aug. 6, 1991

[54] POSITIVE RADIATION-SENSITIVE MIXTURE CONTAINING MONOMERIC ACID-CLEAVABLE COMPOUND AND RADIATION-SENSITIVE RECORDING MATERIAL PRODUCED THEREFROM

[75] Inventor: Karl-Friedrich Doessel, Wiesbaden, Fed. Rep. of Germany

[73] Assignee: Hoechst Aktiengesellschaft, Frankfurt am Main, Fed. Rep. of Germany

[ * ] Notice: The portion of the term of this patent subsequent to Aug. 7, 2007 has been disclaimed.

[21] Appl. No.: 243,818

[22] Filed: Sep. 13, 1988

[30] Foreign Application Priority Data

Sep. 13, 1987 [DE] Fed. Rep. of Germany ....... 3730785

[51] Int. Cl.$^5$ ................................................. G03C 1/72
[52] U.S. Cl. ..................................... 430/270; 430/326; 430/177; 430/176
[58] Field of Search ................ 430/270, 177, 326, 176

[56] References Cited

U.S. PATENT DOCUMENTS

| 3,779,778 | 12/1973 | Smith et al. | 96/115 R |
| 3,887,710 | 6/1975 | Shaver et al. | 424/300 |
| 4,101,323 | 7/1978 | Buhr et al. | 96/35 |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,311,782 | 1/1982 | Buhr et al. | 430/270 |
| 4,421,844 | 12/1983 | Buhr et al. | 430/326 |
| 4,460,445 | 7/1984 | Rekers | 204/159.2 |
| 4,478,977 | 10/1984 | Sperry et al. | 525/61 |
| 4,642,282 | 2/1987 | Stahlhofen | 430/165 |
| 4,737,426 | 4/1988 | Roth | 430/17 |
| 4,806,448 | 2/1989 | Roth | 430/270 |

FOREIGN PATENT DOCUMENTS 3544165 6/1986 Fed. Rep. of Germany .
3601264 7/1986 Fed. Rep. of Germany .

Primary Examiner—Marion E. McCamish
Assistant Examiner—Christopher D. Ro Dee
Attorney, Agent, or Firm—Foley & Lardner

[57] ABSTRACT

A positive radiation-sensitive mixture is disclosed containing a compound which forms an acid under the influence of actinic radiation, and an acid-cleavable compound, wherein the acid-cleavable compound is monomeric and contains an acetal group whose aldehyde or ketone component has a developer solubility of about 0.1 to 100 g/l and a boiling point above about 150° C. The mixture does not exhibit different development properties, even at different "holding times", and therefore exhibits a wide processing latitude and makes possible a high structural resolution.

7 Claims, No Drawings

POSITIVE RADIATION-SENSITIVE MIXTURE CONTAINING MONOMERIC ACID-CLEAVABLE COMPOUND AND RADIATION-SENSITIVE RECORDING MATERIAL PRODUCED THEREFROM

BACKGROUND OF THE INVENTION

The present invention relates to a positive radiation-sensitive mixture containing a compound which forms an acid under the action of actinic radiation, and an acid-cleavable compound.

Positive radiation-sensitive mixtures in which an acid is formed through the action of actinic radiation on a photoinitiator and the acid then, in a secondary reaction, renders the irradiated regions of an acid-cleavable material soluble in an appropriate developer have been known for some time.

Of the acid-cleavable materials employed hitherto in this area, the following have proven successful:
  (a) those containing at least one orthocarboxylic ester and/or carboxamide aceta group, it being possible for the compounds to have a polymeric character and for the groups mentioned to occur as linking elements in the main chain or as lateral substituents,
  (b) oligomeric or polymeric compounds containing recurring acetal and/or ketal groups in the main chain,
  (c) compounds containing at least one enol ether or N-acyliminocarbonate group,
  (d) compounds containing silyl ether groups,
  (e) compounds containing siylenol ether groups, and
  (f) cyclic acetals or ketals of $\beta$-keto esters or amides.

As components of radiation-sensitive mixtures, acid-cleavable compounds of type (a) are described in detail in EP-A-0,022,571 and DE-A-2,610,842; mixtures which contain compounds of type (b) are described in DE-C-2,306,248 and DE-C-2,718,254; compounds of type (c) are mentioned in EP-A-0,006,626 and 0,006,627; compounds belonging to type d) are presented in DE-A-3,544,165 and DE-A-3,601,264; compounds of type (e) can be found in U.S. application Ser. No. 07/243,819 Now U.S. Pat. No. 4,916,046 (corresponding to German Patent Application P 3,730,783.5), filed simultaneously, now U.S. Pat. No. 4,916,046, issued Apr. 10, 1990: compounds of type (f) are mentioned in EP-A-0,202,196.

In DE-A-2,610,842, compounds containing ortho-ester or -amide acetal groups in a radiation-sensitive copying material are described which are used in the production both of printing plates and microelectronic circuits. Investigations have shown that the resolution which is necessary in the submicron region can only be achieved to a limited extent or not at all, using the acid-cleavable compounds outlined therein, which liberate formates of low water solubility on exposure.

The radiation-sensitive copying materials described in DE-A-2,718,254 are also used for lithographic printing plates and for positive resists. They contain, as the acid-cleavable component, an oligomeric compound containing recurring acetal or ketal units, whose alcohol component must be at least dihydric. In addition to the large range, due to the production process, within which the molecular weight or degrees of polymerization of such polyacetals vary, the danger of introduction of contaminants into the radiation-sensitive mixture is particularly critical in the case of these acid-cleavable compounds since distillative purification is no longer possible. Due to the choice of the aldehyde or ketone components, some of the acetals and ketals described result in mixtures which are difficult to develop or allow only a small process window between irradiation and development, generally between 0.1 and 5 hours. Depending on this "holding time", considerable development rate differences occur in some cases and can extend so far that development is no longer possible at all.

Use of a recording material containing an acid-cleavable material of this type results in an unacceptable variation of the process parameters. In addition, the structural resolution is in most cases in need of improvement; this applies in particular when the acetal is too soluble in the developer, for example, in the case of acetals containing 4-hydroxybenzaldehyde as the aldehyde component.

In addition, it has recently been proposed, in contrast to the prior art, to employ cyclic acetals or ketals of $\beta$-keto esters or amides as an acid-cleavable material which is stated to be also suitable for use in photoresists (EP-A-0,202,196). A disadvantage of these photoresists is their low radiation sensitivity.

SUMMARY OF THE INVENTION

It is an object of the present invention to provide a positive radiation-sensitive mixture that exhibits no change with respect to development time during different "holding times" between irradiation and development (i.e., has a large processing latitude), that provides high structural resolution of the developed resist that is retained, even during subsequent processing steps, and that has uniformly good processability, both in metal-ion-containing and metal-ion-free, aqueous-alkaline developers.

These and other objects are achieved with a positive radiation-sensitive mixture comprising a compound which forms an acid under the acion of actinic radiation, and an acid-cleavable compound, wherein the acid-cleavable compound is monomeric and contains an acetal group, the cleavage product of said acid-celvable group being an aldehyde or ketone has a solubility in the developer of about 0.1 to 100 g/l and a boiling point above about 150° C.

A recording material comprising a layer of the radiation-sensitive mixture on a substrate is also provided. A process for producing an imaged recording material comprises the steps of applying a layer of the radiation-sensitive mixture to a substrate, drying the layer, irradiating the layer with actinic radiation, and developing the irradiated layer to produce an image.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The monomeric acetals present in the radiation-sensitive mixture according to the invention have the advantage that they can be purified more readily during their preparation and that no problems occur with polymer phase incompatibility with other polymers in the radiation-sensitive mixture.

The particular suitability of the monomeric acetals employed according to the invention also applies when a polymeric initiator is replaced by a corresponding monomeric material.

The preferred boiling point of the aldehyde or ketone component in the acid-cleavable material is about 150° C. to 300° C., particularly preferably about 150° C. to 270° C.

The solubility in the developer of the hydrolysis products of the acid-cleavable material relates to customary alkaline developers of the metal-ion-containing type and of the metal-ion-free type (see Example 1).

Whereas, in most cases, the alcohol component dissolves readily in the developer, considerable differences arise for the aldehyde and ketone components, so that the solubility of these components is generally decisive for the development behavior of the irradiated recording material.

It has been shown that good results are achieved both with respect to the development kinetics and with respect to the reproduction quality of the structures when the component of the acetal has a developer solubility between about 0.1 and 100 g/l. If the solubility is less than about 0.1 g/l, coatings are obtained that are difficult to develop, whose structural resolution is poor and that tend towards "scumming". If the developer solubility is excessively high, the coatings exhibit inadequate contrast and fine structures cannot be reproduced.

The solubilities of the compounds in the developer can be determined, for example, by introduction of an excess of the compound into the warmed developer, filtration after bringing to room temperature and subsequent determination of the solids content taking into account the solids already present in the developer. Alternatively, the compound may be pre-dissolved in a developer-miscible solvent, the solution thus obtained mixed with the developer and the solvent removed together with the developer liquid in order to determine the solids content. Numerical values are given in the examples.

In the description which follows, the contents of recited references are hereby incorporated by reference.

The choice of the alcohol component for the coating has proven less crucial as long as it is monofunctional. In principle, all alcohols are suitable, in particular, those mentioned in DE-A 2,610,842.

The acetal content in the radiation-sensitive mixture according to the invention is about 2% to 30% by weight, preferably about 10% to 25% by weight, relative to the total weight of the mixture.

Suitable components that preferably form or eliminate a strong acid on irradiation include a large number of compounds and mixtures thereof.

Diazonium, phosphonium, sulfonium and iodonium salts, halogen compounds, o-quinonediazide sulfochlorides and sulfonates and also organometallic/organohalogen combinations may be mentioned.

The diazonium, phosphonium, sulfonium and iodonium compounds mentioned are generally employed in the form of their organic solvent-soluble salts, usually as deposition products with complex acids such as tetrafluoroboric acid, hexafluorophosphoric acid, hexafluoroantimonic acid and hexafluoroarsenic acid. Inter alia, these compounds are also mentioned in DE-A-3,601,264.

The halogen compounds include, in particular, triazine derivatives, which are known from US-A-3,515,552, 3,536,489 and 3,779,778, and DE-C-2,718,259, 3,337,024, 3,333,450, 2,306,248, 2,243,621 and 1,298,414. However, they can also be employed in combination with other photoinitiators, such as oxazoles, oxadiazoles or thiazoles, and in mixtures with one another.

Oxazoles, oxadiazoles, thiazoles or 2-pyrones which contain trichloromethyl or tribromomethyl groups are also known (DE-A-3,021,599, 3,021,590, 2,851,472 and 2,949,396 and EP-A-0,135,348 and 0,135,863).

Also included are, in particular, aromatic compounds which contain ring-bound halogen, preferably bromine. Such compounds are known from DE-A-2,610,842, or are described in U.S. application Ser. No. 07/442,394 pending (corresponding to German Patent Application P 3,730,784 3), filed simultaneously.

A representative of a combination with a thiazole which may be mentioned is one with 2-benzoylmethylene-naphtho-[1,2-d]thiazole (DE-A-2,851,641 and DE-A-2,934,758). A mixture of a trihalomethyl compound with N-phenylacridone is known from DE-A-2,610,842.

Likewise, α-halocarboxamides (DE-A-2,718,200) or tribromomethyl phenyl sulfones (DE-A-3,503,113), which can be sensitized, for example, by benzophenone, benzil or Michler's ketone, are also available.

In general, the effectiveness of all the radiation-sensitive compounds described can be supported by photosensitizers. Anthracene, phenanthrene, pyrene, 1,2-benzanthrene, thiazines, pyrazolines, benzofurans, benzophenones, fluorenones, anthraquinones and coumarine derivatives, for example, may be mentioned. Their content is about 0.01% to 5% by weight, relative to the weight of the radiation-sensitive mixture.

Above all, triazine derivatives and aromatic compounds containing ring-bound halogen, in particular, bromine, known from DE-A-2,610,842 and U.S. application Ser. No. 07/442,394 (corresponding to German Pat. application P 3,730,784.3), filed simultaneously, are particularly preferred.

Of the compounds mentioned in this application, those are preferred which have a $pK_a$ value of about 6 to 10, very particularly those which come under the general formula I

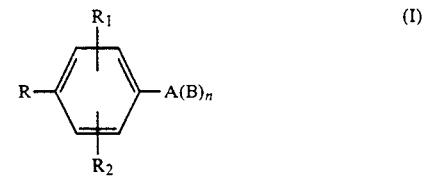

containing at least one aromatically-1y-bound chlorine or bromine atom, in which:

R denotes carboxyl, OR' or SR', $R_1$ and $R_2$ are identical or different and denote hydrogen, chorine, bromine, alkyl, which is optionally substituted by aryl, alkoxy, aryloxy, hydroxyl groups or by fluorine atoms; or alkyl, which is optionally substituted by alkoxy, aryloxy, hydroxyl groups or by halogen atoms, R' denotes hydrogen, alkyl which is optionally substituted by aryl, alkoxy, aryloxy or hydroxyl groups or by fluorine atoms; aryl which is optionally substituted by alkoxy, aryloxy or hydroxyl groups or by halogen atoms; acyl, alkylsulfonyl, arylsulfonyl, alkoxycarbcnyl, triorganosilyl, triorganostannyl or denotes an alkylene, arylene, bisacyl, sulfonyl, alkylenedlsulfonyl, arylene disulfonyl, diorganosilyl or diorganostannyl group whose second valency is bonded to the 0 atom of a further unit of the formula I, it being possible for the alkylene and arylene groups to be substituted in corresponding manner to the alkyl and aryl radicals, and n denotes 0 to 3,
where
for n=0:
A denotes hydrogen, chlorine, bromine, alkyl, which is optionally substituted by alkoxy, aryloxy, hydroxyl or aryl radicals or by fluorine atoms or aryl, which is optionally substituted by alkoxy, aryloxy, hydroxyl, carboxyl radicals or by halogen atoms,
for n=1
A denotes a single bond -O-, -S-, -SO$_2$-,
5 -NH-,-NR$_3$-, alkylene or perfluoroalkylene,
for n=2:
A denotes

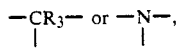

and
for n=3:
A denotes

and
denotes

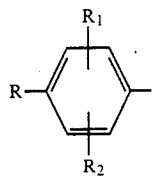

carboxyl, substituted carbonyl, in particular, alkylcarbonyl or arylcarbonyl, carboxyalkyl or substituted sulfonylimidocarbonyl, and R$_3$ denotes alkyl, in particular, (C$_1$–C$_3$) alkyl, or aryl, in particular, phenyl These compounds are preferably only cleaved by high-energy radiation, i.e., short-wave radiation. In addition to UV radiation, this includes, above all, electron-beam radiation and X-ray radiation.

Besides monomeric radiation-sensitive acid formers, it is also possible to employ polymers of this type. When monomeric initiators are used, their content is in the range of about 0.01% to 30% by weight, in particular, about 0.4% to 20% by weight, relative to the weight of the radiation-sensitive mixture.

If polymeric initiators are used, it may be possible to omit a polymeric binder. In addition, a polymeric initiator can be mixed with a binder. It is also possible for monomeric components of a non-polymerized initiator to react with monomeric components to form a co-condensate or copolymer. In this case, the contents of initiator may extend beyond the range described in the case of monomeric initiators depending on the proportion of the content of the polymer in this mixture. In particular, contents of greater than about 50% by weight and up to 100% by weight, relative to the weight of the radiation-sensitive mixture less the contents of the acid-cleavable compound, are suitable.

The radiation-sensitive mixture according to the invention may additionally comprise a binder that is insoube in water, but soluble, or at least swellable, in organic solvents and alkali. Such binders include, above all, phenolic resins of the novolak type. Phenol-formaldehyde resins, cresol-formaldehyde resins, the co-condensates and mixtures thereof, are mentioned.

In addition, it is also possible to employ vinyl polymers, such as poly(vinyl acetals), polymethacrylates, polyacrylates, poly(vinyl ethers), polyvinylpyrrolidones and styrene polymers, in each case optionally modified bY comonomers, which are either used alone or mixed with others.

The following may be mentioned in particular: polymers of styrene with alkenyl sulfonyl amino carbonyloxy or cycloalkenyl sulfonyl amino carbonyloxy units (EP-A-0,184,804), polymers of acrylic acid, methacrylic acid, maleic acid, itaconic acid, etc., containing lateral, crosslinking -CH$_2$OR groups (EP-A-0,184,044), polymers made of vinyl monomers and alkenylphenol units (EP-A-0,153,682), polyvinylphenols as novolak substitute (DE-C-2,322,230), polymeric binders containing lateral, phenolic hydroxyl groups (EP-A-0,212,439 and 0,212,440), styrene-maleic anhydride copolymers (DE-A-3,130,987), polymers made from unsaturated (thio)phosphinic acid iso(thio)cyanates with a polymer containing active hydrogen (German Patent Applications P 3,615,612.4 and P 3,615,613.2), polymers containing vinyl acetate, vinyl alcohol and vinyl acetal units (EP-A-0,216,083), and poly(vinyl acetals) containing units of hydroxyaldehydes (German Patent Application P 3,644,162.7).

The amount of binder is generally about 1% to 90%, in particular, about 5% to 90% by weight, and most preferably about 50% to 90% by weight, relative to the total weight of the radiation-sensitive mixture.

Additionally, dyes, pigments, plasticizers, wetting agents and levelling agents, and also polyglycols and cellulose ethers, for example, ethylcellulose, may optionally be added to the radiation-sensitive mixtures according to the invention in order to improve specific properties such as flexibility, adhesion and gloss.

The radiation-sensitive mixture according to the invention is preferably dissolved in solvents, such as ethylene glycol, glycol ethers, such as glycol monomethyl ether, glycol dimethyl ether, glycol monoethyl ether or propylene glycol monoalkyl ethers, in particular, propylene glycol methyl ether; aliphatic esters, such as ethyl acetate, hydroxyethyl acetate, alkoxyethyl acetate, n-butyl acetate, propylene glycol monoalkyl ether acetate, in particular, propylene glycol methyl ether acetate, or amyl acetate; ethers, such as dioxane, ketones, such as methyl ethyl ketone, methyl isobutyl ketone, cyclopentanone and cyclohexanone; dimethylformamide, dimethylacetamide, hexamethylphosphoric amide, N-methylpyrrolidone, butyrolactone, tetrahydrofuran, and in mixtures thereof. Glycol ethers, aliphatic esters and ketones are particularly preferred.

The solutions produced using the remaining components of the radiation-sensitive mixture generally have a solids content of about 5% to 60% by weight, preferably up to about 50% by weight.

A radiation-sensitive recording material is also provided according to the invention, comprising a substrate and the radiation-sensitive mixture applied thereto.

Suitable substrates are all materials used for condensers, semiconductors, multilayer printed circuits or integrated circuits. In particular, surfaces which are made of thermally-oxidized and/or aluminum-coated silicon material and may optionally also be doped may be mentioned including all other substrates which are customary in semiconductor technology, such as, for example, silicon nitride, gallium arsenide and indium phosphide. In addition, the substrates which are known from the manufacture of liquid-crystal displays, such as glass, indium/tin oxide; metal plates and foils, for example, made of aluminum, copper or zinc; bimetallic and trimetallic foils; and also electrically-nonconductive foils which are vapor-coated with metals, optionally aluminum-coated $SiO_2$ materials and paper, are suitable. These substrates may be subjected to thermal pretreatment, and may be superficially roughened, etched or treated with chemicals in order to achieve desired properties, such as, for example, increased hydrophilicity.

In a particular embodiment, the radiation-sensitive mixture can contain an adhesion promoter for better adhesion, which may be contained in the resist formulation or is applied between the resist and the substrate. In the case of silicon or silicon dioxide substrates, adhesion promoters of the aminosilane type, such as for example, 3-amino-propyltriethoxysilane or hexamethyldisilazane, are suitable for this purpose.

Examples of substrates which can be used for the production of photomechanical recording materials, such as printing forms for letterpress printing, planographic printing, screen printing and rotogravure printing, and for the production of relief copies, are aluminum plates, optionally anodically oxidized, grained and/or silicated aluminum plates, zinc plates, steel plates, which have optionally been coated with chromium, and plastic films or paper.

The recording material according to the invention is irradiated imagewise. Suitable sources of actinic radiation include metal halide lamps, carbon arc lamps, xenon lamps and mercury vapor lamps. Irradiation with high-energy radiation such as laser, electron-beam or X-ray radiation is preferred. Lasers which may be mentioned are, in particular, helium/neon lasers, argon lasers, krypton lasers and helium/cadmium lasers.

The amount of coating varies depending on the field of use. For example, when the radiation-sensitive mixture is applied to a printing plate, the preferred amount of coating is about 0.5 to 3.5 g/m². In general, layer thicknesses are between about 0.1 and 100 μm, in particular, between about 1 and 10 μm.

The invention also relates to a process for the production of a radiation-sensitive recording material. The radiation-sensitive mixture can be applied to the substrate by spraying, flow-coating, roller-coating, spin-coating or dip-coating. The sovent is then removed by evaporation, leaving the radiation-sensitive layer on the surface of the substrate. The removal of the solvent can be accelerated, if desired, by heating the layer to temperatures of up to about 160° C. However, it is also possible to initially apply the mixture in the above-mentioned manner to an intermediate substrate, from which it is transferred onto the final substrate material under pressure at elevated temperature.

The layer is subsequently irradiated imagewise. Actinic radiation is usually used, UV, X-ray or electron-beam radiation being particularly preferred. UV lamps which emit radiation having wavelengths of about 200 to 500 nm at an intensity of about 0.5 to 60 mW/cm² are usually used for irradiation. In the radiation-sensitive layer, an image pattern is subsequently produced by treating the layer with a developer solution to dissolve or remove the irradiated areas of the material.

The developers used are solutions of alkaline reagents, such as, for example, silicates, metasilicates, hydroxides, hydrogen phosphates, dihydrogen phosphates, carbonates or hydrogen carbonates, in particular, of alkali metal ions or ammonium ions, but also ammonia, organic ammonium hydroxides and the like. The content of these substances in the developer solution is generally about 0.1% to 15% by weight, preferably i5 about 0.5% to 5% by weight, relative to the weight of the developer solution.

In order to increase the resistance to mechanical and chemical influences, in particular, to etching media, the developed layers can be heated for some time, for example, about 5 to 40 minutes, at elevated temperature, for example, above 100° C., it being possible for this effect to be further supported by exposure with UV radiation.

The acetals present in the radiation-sensitive mixtures according to the invention can be prepared by condensation of the aldehyde or ketone with the alcohol with azeotropic distillative removal of the water of reaction. In another known variant, the aldehyde or ketone is reacted with trimethyl orthoformate to form the dimethyl acetal. In a second step, this is then reacted with an alcohol to form the desired acetal. Surprisingly, it has been found that simultaneous addition of orthoester and alcohol to the carbonyl compound in the preparation of the acetals does not lead to transesterification products of the otheroester which are undesired here, but instead only leads to the desired acetals.

The preparation of a novel, acid-cleavable compound present in the radiation-sensitive mixture according to the invention is illustrated by means of the Examples below.

PREPARATION EXAMPLE 1

0.5 g of p-toluenesulfonic acid was added with cooling to a mixture of 1 mol of piperonal, 2 mol of n-butoxyethanol and 1.1 mol of trimethyl orthoformate. The mixture was stirred at room temperature for 2 hours. A water-pump vacuum was subsequently applied to the mixing apparatus, and stirring was continued for 2 hours at each of 20° C., 40° C. and 60° C. The reaction mixture was subsequently passed through a thin-film evaporator at 80° C. under pressure of 0.1 torr. If necessary, further distillation can take place in the thin-film evaporator at appropriately elevated temperature.

The resultant acetal was stirred with $Na_2CO_3$, $K_2CO_3$ or basic aluminum oxide to neutralize the acid catalyst. The solid components were removed and the filtrate was evaporated in vacuo. It was possible to employ the acetal in this form in a recording material. It was an oil of boiling point 170° C. (0.01 torr); no CO signal could be detected in the IR spectrum; the NMR spectrum ($CDCl_3$) exhibited an acetal signal at $\delta = 5.58$ ppm.

PREPARATION EXAMPLE 2

4-Ethylbenzaldehyde-bis-(n-butoxyetoxyethyl)acetal 1 mol of 4-ethylbenzaldehyde and 2 mol of n-butoxyethoxyethanol were employed in a corresponding manner to preparation Example 1. An acetal of boiling point 175° C. (0.005 torr) was isolated. The NMR spectrum (CDCl$_3$) exhibited a signal for an acetal at $\delta = 5.63$ ppm.

PREPARATION EXAMPLES H3 to H6

The following acetals were prepared in an analogous manner:

H3 Piperonal-bis-[2-(2-methoxy) ethoxyethyl]acetal B.p. >170° C. (0.05 torr), NMR spectrum (CDCl$_3$) $\delta = 5.55$ ppm (acetal)

H4 Benzaldehyde dioctyl acetal B.p. 148° C. (0.02 torr), NMR spectrum (CDCl$_3$) $\delta = 5.50$ ppm (acetal)

H5 Terephthaldialdehyde tetrakis-(n-butoxyethoxyethyl)acetal NMR spectrum (CDCl$_3$)13) $\delta = 5.67$ ppm (acetal)

H6 Thiophen-2-aldehyde dimethoxyethyl acetal NMR spectrum (CDCl$_3$) $\delta = 5.85$ ppm (acetal)

The application examples below are intended to illustrate the invention in greater detail; amounts are given in parts by weight (pw).

EXAMPLE 1

A coating solution was produced from:

| | |
|---|---|
| 17 pw | of a cresol-formaldehyde novolak having a softening range of 105°–120° C., |
| 5 pw | of piperonal dibutoxyethyl acetal (Preparation Example 1, boiling point of piperonal 264° C., solubility in the developer: 3.5 g/l, and |
| 4 pw | of tetrabromobisphenol A (Dow Chemical) in |
| 74 pw | of propylene glycol methyl ether acetate. |

The solution was spin-coated at 3,000 rpm onto a silicon wafer which had been treated with an adhesion promoter (hexamethyldisilazane). After drying at 85° C. for 30 minutes in a circulation oven, layer thickness of 1 μm was obtained. Imagewise irradiation was carried out using synchrotron radiation (BESSY, Berlin, air gap 2 mm) in a dose of mJ/cm$^2$ through a gold-on-silicon mask. The experimental arrangement can be found in A. Heuberger, "X-Ray Lithography", *Microelectronic Engineering* 3: 535–556 (1985). After a holding time of 50 minutes, the material was developed using an alkaline developer of the following composition:

| | |
|---|---|
| 5.3 pw | of sodium metasilicate ×9 H$_2$O, |
| 3.4 pw | of trisodium phosphate ×12 H$_2$O, |
| 0.3 pw | of sodium dihydrogen phosphate, and |
| 91 pw | of demineralized water. |

A flaw-free image containing all the details of the mask was obtained, even 0.3 μm lines and spaces having been reproduced without faults. The resist edges were not undercut and exhibited angles of virtually 90. (in a photomicrograph from a scanning electron microscope (SEM)).

EXAMPLE 2

A coating solution and a resist were produced in a corresponding manner to Example 1; however, the acetal specified therein was replaced by the same amount of benzaldehyde dioctyl acetal (preparation Example 4) (boiling point of benzaldehyde: 181° C.; solubility in the developer 4 g/l). The results with respect to resolution and angle of the resist edges to the substrate after development with the developer from Example 1 were comparable with those from Example 1.

EXAMPLE 3

A coating solution was produced in a corresponding manner to Example 1. The acetal specified therein was replaced by terephthaldialdehyde tetrakis-(n-butyloxyethoxyethyl)acetal (preparation Example 5) (boiling point of terephthaldialdehyde: 245° C.; solubility in the developer: 2 g/l). After exposure of the resist, it was developed using the developer as in Example 1, giving no differences.

The influence of the holding time, the time between irradiation and development, on the results data was investigated for additional silicon wafers produced in the same manner. At holding times of 1.4 to 12 hours, however, no differences in the results could be determined.

EXAMPLE 4 (Comparison example)

The acetal employed in Example 1 was replaced by hexanal dibutoxyethyl acetal in a coating solution which otherwise corresponded entirely to that of Example 1 (boiling point of hexanal: 156° C., 15 solubility of the aldehyde in the developer: <0.1 g/l). Whereas the development time was 60 seconds 5 minutes after irradiation, as much as 90 seconds were required at a hold time of 2 hours. The structural resolution of this sample was clearly worse than 0 that obtained in Example 1.

EXAMPLE 5

A coating solution was produced containing:

| | |
|---|---|
| 11 pw | of a cresol-formaldehyde novolak having a softening range of 105°–120° C., |
| 11 pw | of a brominated poly(p-hydroxy)styrene having a bromine content of 50% by weight, and |
| 5 pw | of p-ethylbenzaldehyde-bis-(n-butoxyethoxyethyl)acetal (preparation Example 2) in |
| 73 pw | of propylene glycol methyl ether acetate. |

The layer was applied, irradiated and developed in a corresponding manner to Example The resolving power and the behavior of the resist edges were identical to those from Example 1.

EXAMPLE 6

A coating solution was produced containing:

| | |
|---|---|
| 5 pw | of a poly(pyrocatechol-monomethacrylate), |
| 0.1 pw | of 2-(4-ethoxynaphth-1-yl)-4,6-bis-(trichloro-methyl-s-triazine), and |
| 1 pw | of thiophen-2-aldehyde dimethoxyethyl acetal (preparation Example 6, boiling point of thiophen-2-aldehyde: 197° C.) in |
| 94 pw | of butan-2-one. |

The coating solution was applied in a manner known onto a 0.3 mm thick aluminum printing plate support.

The aluminum support had previously been electrochemically roughened, anodized and rendered hydrophilic using polyvinylphosphonic acid. After drying the layer, a layer weight of 1.6 g/m2 was obtained.

The offset printing plate produced in this manner was covered with a copying mask and irradiated for 20 seconds with radiation from a high-pressure mercury vapor lamp (5 kW) at a distance of 110 cm. The plate was developed using the developer from Example. A positive printing form of high resolution which gave 100,000 fault-free prints in an offset printing machine was obtained.

What is claimed is:

1. A positive radiation-sensitive mixture, comprising:
    a compound that forms an acid under the action of actinic radiation;
    an acid-clevable compound and
    a binder that is insoluble in water and soluble in aqueous-alkaline solutions;
    wherein the acid-clevable compound is monomeric and contains an acetal group, the clevage product of said acid-clevable compound being an aldehyde or ketone that has a developer solubility of about 0.1 to 100 g/l and a boiling point above about 150° C.

2. A radiation-sensitive mixture, as claimed in claim 1, wherein the monomeric acetal is a monoacetal.

3. A positive radiation-sensitive recording material, comprising:
    a substrate; and
    a radiation-sensitive layer on said substrate comprising a radiation-sensitive mixture as claimed in claim 1.

4. A process for the production of an imaged positive radiation-sensitive recording material, comprising the steps of:
    applying a layer of a radiation-sensitive mixture as claimed in claim 1 to a substrate;
    drying the layer;
    irradiating the dried layer imagewise with actinic radiation; and
    developing the irradiated layer using an aqueous-alkaline developer to produce an image.

5. A radiation-sensitive mixture, as claimed in claim 1, wherein the boiling point of the aldehyde or ketone component is about 150° to 270° C.

6. A radiation-sensitive mixture, as claimed in claim 1, comprising from about 2% to 30% by weight of acetal, relative to the total weight of the mixture.

7. A radiation-sensitive mixture as claimed in claim 1, comprising from about 10% to 25% by weight of acetal, relative to the total weight of the mixture.

* * * * *